(12) United States Patent
Shue et al.

(10) Patent No.: US 8,629,058 B2
(45) Date of Patent: Jan. 14, 2014

(54) METHODS FOR VIA STRUCTURE WITH IMPROVED RELIABILITY

(75) Inventors: Shau-Lin Shue, Hsin-Chu (TW); Cheng-Lin Huang, Hsin-Chu (TW); Ching-Hua Hsieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/595,835

(22) Filed: Aug. 27, 2012

(65) Prior Publication Data

US 2012/0322261 A1  Dec. 20, 2012

Related U.S. Application Data

(63) Continuation of application No. 11/294,217, filed on Dec. 5, 2005, now Pat. No. 8,264,086.

(51) Int. Cl.
  *H01L 21/4763* (2006.01)

(52) U.S. Cl.
  USPC ........... 438/640; 438/638; 438/672; 438/675; 257/774

(58) Field of Classification Search
  USPC ......... 438/622, 629, 637, 626, 627, 675, 638, 438/639, 640, 672; 257/E21.259, E21.576, 257/774, 775, 700, 762, 758, 752, 751, 765, 257/763, 767, 771, 759, 773
  See application file for complete search history.

(56) References Cited

U.S. PATENT DOCUMENTS

| | | | |
|---|---|---|---|
| 5,872,053 A * | 2/1999 | Smith | 438/626 |
| 6,114,766 A | 9/2000 | Shields | |
| 6,117,793 A | 9/2000 | Tang | |
| 6,211,068 B1 | 4/2001 | Huang | |
| 6,221,758 B1 | 4/2001 | Liu et al. | |
| 6,624,066 B2 | 9/2003 | Lu et al. | |
| 6,734,116 B2 | 5/2004 | Guo et al. | |
| 6,797,642 B1 | 9/2004 | Chu et al. | |
| 6,803,305 B2 | 10/2004 | Yen et al. | |
| 7,119,009 B2 | 10/2006 | Watanabe et al. | |
| 7,190,078 B2 | 3/2007 | Khandekar et al. | |
| 7,241,696 B2 | 7/2007 | Clevenger et al. | |
| 7,492,020 B2 | 2/2009 | Suzuki | |
| 2002/0119653 A1* | 8/2002 | Yamane | 438/637 |
| 2004/0072412 A1 | 4/2004 | Kim | |
| 2005/0106919 A1 | 5/2005 | Layadi et al. | |
| 2005/0287795 A1 | 12/2005 | Torek et al. | |
| 2006/0024953 A1 | 2/2006 | Papa Rao et al. | |
| 2006/0180947 A1 | 8/2006 | Loechelt et al. | |
| 2007/0035026 A1* | 2/2007 | Su et al. | 257/758 |

OTHER PUBLICATIONS

Intel BX80546PG2800E PentiumR4 Prescott Microprocessor Structural Analysis Photographs, 6 pages, Sep. 29, 2003.

* cited by examiner

*Primary Examiner* — Thanh Y Tran
(74) *Attorney, Agent, or Firm* — Slater & Matsil, L.L.P.

(57) ABSTRACT

Methods for forming a via structure are provided. The method includes depositing a first-layer conductive line over a semiconductor substrate, forming a dielectric layer over the first-layer conductive line, forming a via opening in the dielectric layer and exposing the first-layer conductive line in the via opening, forming a recess portion in the first-layer conductive line, and filling the via opening to form a via extending through the dielectric layer to the first-layer conductive line. The via has a substantially tapered profile and substantially extends into the recess in the first-layer conductive line.

20 Claims, 5 Drawing Sheets

METHODS FOR VIA STRUCTURE WITH IMPROVED RELIABILITY

This application is a continuation of U.S. patent application Ser. No. 11/294,217, filed on Dec. 5, 2005, entitled "Via Structure with Improved Reliability," which application is hereby incorporated herein by reference in its entirety.

TECHNICAL FIELD

This invention relates generally to semiconductor devices, and more particularly to via structures and methods for manufacturing the same.

BACKGROUND

Modern integrated circuits are made up of literally millions of active devices such as transistors and capacitors. These devices are initially isolated from one another but are later interconnected together to form functional circuits. The quality of the interconnection structure drastically affects the performance and reliability of the fabricated circuit. Interconnections are increasingly determining the limits of performance and density of modern integrated circuits.

FIG. 1 is a cross-sectional illustration of a conventional interconnection structure used in the semiconductor industry. Metal interconnections 104 and 106, which are typically formed of copper, aluminum or alloys thereof, are used to couple active devices (not shown) into functional circuits. Metal interconnections 104 and 106 are electrically isolated from one another by a dielectric layer 108. Electrical connections are made between metal interconnections 104 and 106 through a metal via 112.

The interconnection structure of FIG. 1 experiences several problems. As integrated circuit dimensions decrease, in order to increase circuit density, vias are becoming smaller by the square of the dimension decrease. Such small vias can cause both reliability and performance problems in an integrated circuit. Reliability problems are caused by high concentrations of current or current crowding at the corner region 114 of the via 112. Current crowding in the corner region 114 can cause self-heating effects, hence electro-migration. As a result, voids, open circuits and other reliability problems arise.

Another problem is the poor step coverage of the diffusion barrier layer. The performance of small-dimensioned vias is adversely affected due to an increase in contact resistance caused by a reduction of the interfacial contact area between the via 112 and interconnections 104 and 106. The use of a diffusion barrier layer 116 further worsens the problem. Typically, copper, which is increasingly used for the formation of the via 112 and metal interconnections 104 and 106, diffuses into the dielectric layer 108 easily, shorting integrated circuits and causing circuit failure. The diffusion barrier layer 116 is therefore formed to prevent copper from diffusing into the dielectric layer 108. Since the sidewall of the via 112 is typically substantially vertical, thickness $T_s$ of the diffusion barrier layer 116 on the sidewall is only a fraction of the thickness $T_B$ at the bottom. In order to have a diffusion barrier 116 with a sufficient thickness $T_s$ on the sidewall, the thickness $T_B$ has to be greater than is necessary to be an effective barrier. The diffusion barrier layer 116 is typically formed of materials having much higher resistivity than copper, such as titanium, titanium nitride, tantalum, tantalum nitride, and the like. A diffusion barrier having a thicker bottom portion will have a significantly greater resistance. Since the resistance of the bottom portion of the diffusion barrier layer 116 is connected in series with the resistance of the via 112, the total interconnection resistance is significantly increased.

To solve the previously discussed problems, a tapered via has been designed, as illustrated in FIG. 2. A via 124, which connects metal interconnections 104 and 106, has at least a significant portion tapered. Since the sidewalls are slanted, the thickness difference of the diffusion barrier layer 126 on the sidewall and at the bottom of the via 124 is reduced, and overall via resistance is reduced.

Even with the structure shown in FIG. 2, metal interconnection still has significant effects on the performance and reliability of the integrated circuit. Thus, further performance and reliability improvement is needed.

SUMMARY OF THE INVENTION

A via structure having improved reliability and performance and methods of forming the same are provided.

In accordance with one aspect of the present invention, the via structure includes a first-layer conductive line, a second-layer conductive line, and a via electrically coupled between the first-layer conductive line and the second-layer conductive line. The via structure further includes a diffusion barrier layer adjacent a dielectric layer in which the via is formed. The via has a substantially tapered profile and substantially extends into a recess in the first-layer conductive line. With a tapered via, the step coverage of the diffusion barrier layer is improved. The via preferably has a rounded profile in an interface region between the via and the second-layer conductive line.

In accordance with another aspect of the present invention, a method of forming the preferred embodiments of the present invention includes forming a first-layer conductive line, forming a first dielectric layer over the first-layer conductive line, forming a second dielectric layer over the first dielectric layer, forming a via opening having a tapered profile in the first dielectric layer, forming a trench opening in the second dielectric layer, forming a recess in the first-layer conductive line, forming a via in the via opening and the recess, and forming a second-layer conductive line over the via. The first dielectric layer preferably has a low dielectric constant.

In accordance with yet another aspect of the present invention, the via opening having a tapered profile is formed using bombardment, preferably using argon, with the scattering factor adjusted to a desired value. More than one bombardment can be performed with each bombardment having a different scattering factor.

In accordance with yet another aspect of the present invention, the recess is formed by sputtering. Preferably a diffusion barrier layer is formed in the via opening and the trench opening prior to the sputtering.

The preferred embodiments of the present invention have improved reliability due to reduced maximum current density in the via. Performance is improved as a result of the reduced via resistance.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Methods for forming a novel via structure having improved reliability and reduced resistance are provided. Variations of the preferred embodiments are then discussed. Throughout the various views and illustrative embodiments of the present invention, like reference numbers are used to designate like elements.

Figure 3:
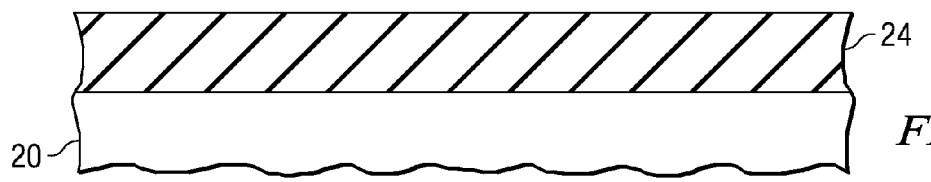
FIGS. 3 through 12 are cross-sectional views of intermediate stages in the manufacture of the preferred embodiment of the present invention.
Figure 4:
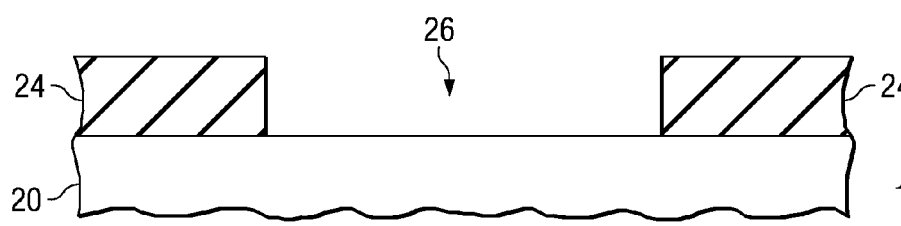

FIGS. 3 through 12 are cross-sectional views of intermediate stages in the making of the preferred embodiments of the present invention. FIG. 3 shows a base material 20 and a dielectric layer 24. In the preferred embodiment, the base material 20 may comprise a dielectric material, such as an inter-layer dielectric (ILD) layer or an inter-metal dielectric (IMD) layer, and may comprise a conductive feature (not shown) coupling the subsequently formed conductive line to other devices. The dielectric layers 20 and 24 preferably comprise a material having a low dielectric constant less than 3.5, and may contain nitrogen, carbon, hydrogen, oxygen, fluorine, and combinations thereof. The preferred formation methods include, e.g., chemical vapor deposition (CVD), spin-on, atomic layer deposition (ALD), plasma enhanced CVD (PECVD), and other well-known deposition techniques. More preferably, the dielectric layers 20 and 24 are porous films with dielectric constants less than about 2.8. A trench 26 is then formed in the dielectric layer 24, as shown in FIG. 4, preferably by etching the dielectric layer 24.

Figure 5:
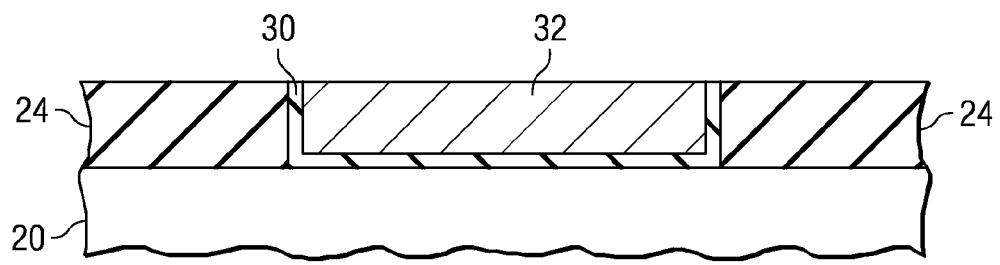

FIG. 5 illustrates a diffusion barrier layer 30 and a conductive line 32 (sometimes referred to herein as a first conductive line 32) formed in the trench 26. The barrier layer 30 is preferably formed of a material comprising titanium, titanium nitride, tantalum, tantalum nitride, ruthenium, ruthenium nitride, or other alternatives. The conductive line 32 preferably comprises copper or copper alloys, although it may comprise other conductive materials such as aluminum, silver, gold, metal alloy, and the like. In the preferred embodiment, the conductive line 32 is formed by depositing a thin layer of seed copper or copper alloy, then plating to fill the trench 26. In other embodiments, commonly used chemical vapor deposition (CVD) methods such as plasma enhanced CVD can be used. A chemical mechanical polish (CMP) is performed to level the surfaces of the conductive line 32 and dielectric layer 24.

Figure 6:
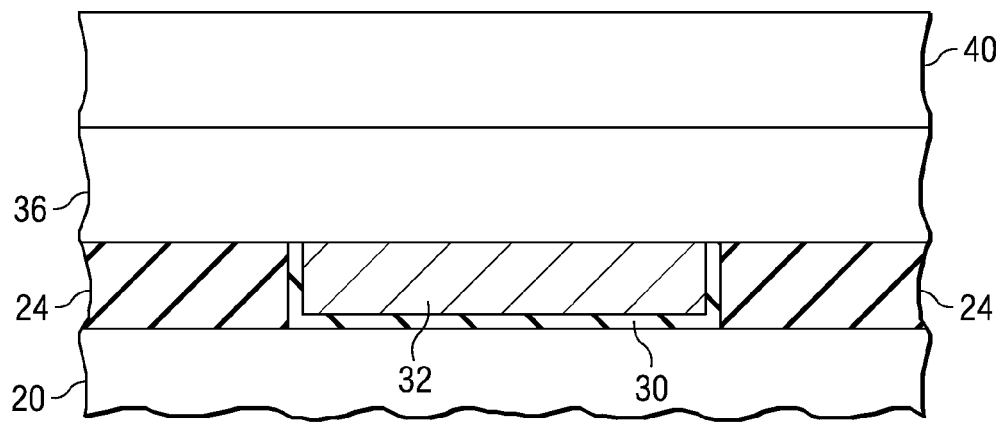

In the preferred embodiment, after the conductive line 32 is formed, dual damascene processes are performed to form a via and a second conductive line in a dielectric layer over the dielectric layer 24. Although in the subsequently discussed embodiment, the via and the second conductive line are formed in two dielectric layers (refer to FIG. 6), one skilled in the art will realize that the via and the overlying conductive line may be formed in a single dielectric layer. In alternative embodiments, the via and the second-layer conductive line can be formed by single damascene processes. For illustration purposes, only a via-first approach is discussed. One skilled in the art will realize that the preferred embodiments of the present invention are well suited for trench-first approaches. Referring to FIG. 6, a via IMD layer 36 and a trench IMD layer 40 are successively formed. The via IMD layer 36 preferably has a k value less than about 3.5, and may comprise carbon-doped silicon oxide, fluorine-doped silicon oxide, organic low-k materials, and/or porous low-k materials. It is preferably formed by spin-on, chemical vapor deposition (CVD), or other known methods. More preferably, the dielectric layers 36 and/or 40 can also be porous films having low dielectric constants of less than about 2.8. The materials and methods of forming the via IMD layer 36 and trench IMD layer 40 are known in the art, hence are not discussed herein. In the preferred embodiment, the materials of the dielectric layer 24 and the IMD layers 36 and 40 have different etching characteristics, so that one layer can be used as an etch stop layer when the overlying layer is etched. In alternative embodiments, etch stop layers (not shown) can be formed between layers 24, 36 and 40.

Figure 7:
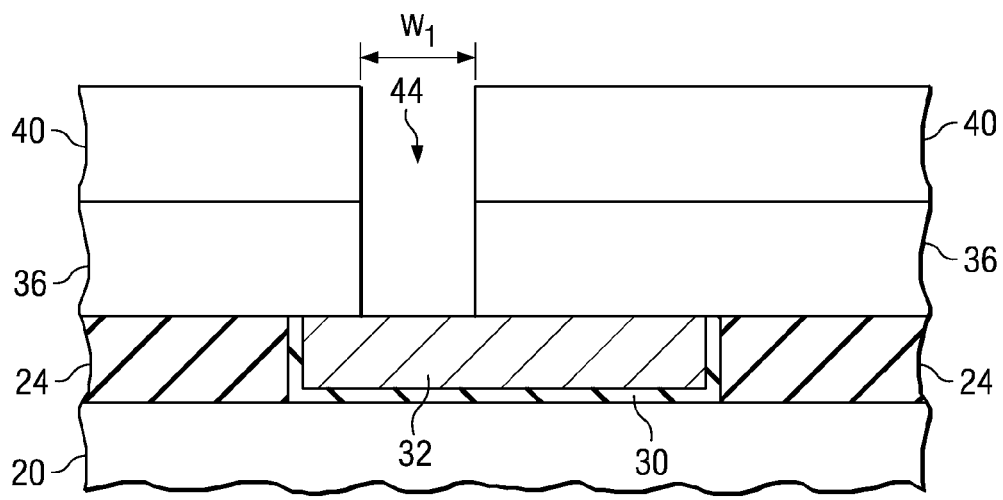

FIG. 7 illustrates the formation of a via opening 44. A photo resist (not shown) is formed and patterned over the trench IMD layer 40. An anisotropic etching cuts through the trench IMD layer 40 and the via IMD layer 36 and stops at the conductive line 32, therefore forming a via opening 44. The via opening 44 preferably has a width $W_1$ of less than about 190 nm.

Figure 8:
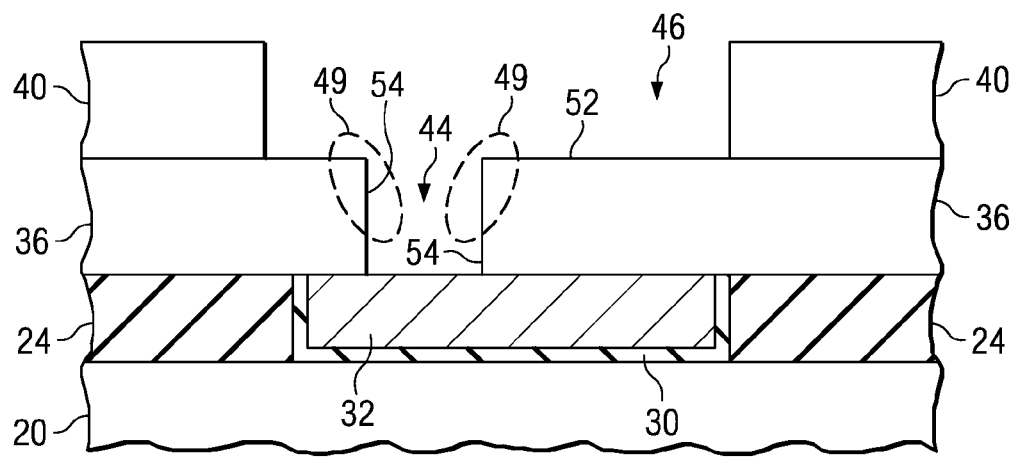

FIG. 8 illustrates the formation of a trench opening 46. With the masking of a photo resist (not shown), an anisotropic etching cuts through the trench IMD layer 40, forming the trench opening 46. Trench opening 46 will be used to form a second conductive line when filled with a conductive material.

Figure 9:
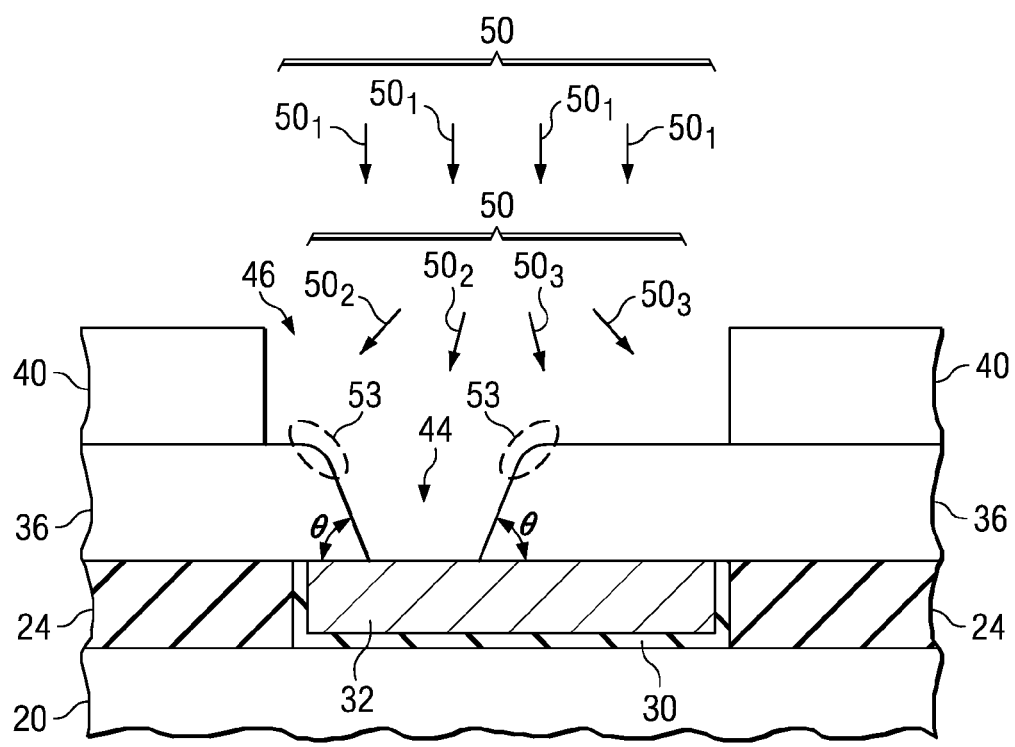

The via opening 44 is then shaped by removing corner regions 49 of the via IMD layer 36, so that a tapered profile is generated. In the preferred embodiment, a bombardment is performed to remove corner regions 49, as illustrated in FIG. 9. The bombardment, preferably using argon, is symbolized by arrows 50 and comprises vertical components $50_1$ and tilt components $50_2$ and $50_3$. The ratio of the tilt components $50_2$ and $50_3$ and the vertical components $50_1$ can be represented by a scattering factor, which is adjustable. The greater the scattering factor is, the more tilt components $50_2$ and $50_3$ are comprised in the bombardment. Typically, with a bombardment having a low scattering factor, more material of the via IMD layer 36 at the top surface 52 (refer to FIG. 8) is removed. When the scattering factor increases, more material of the via IMD layer 36 is removed from a sidewall 54 (refer to FIG. 8). With a suitable scattering factor, the via opening 44 forms a desired tapered profile. For example, if the via IMD layer 36 is formed using a physical bombardment process, a via opening profile similar to that is shown in FIG. 9 can be obtained with an exemplary bombardment having a scattering factor of greater than about 70 percent, a bombardment energy of greater than about 5 eV, and a bombardment time of greater than about 4 seconds. More than one bombardment, each having a different scattering factor, may be performed to achieve an optimum effect. Also, the interface regions 53 between the via opening 44 and trench opening 46 preferably have a rounded profile.

The previously discussed processes only show one of the methods for forming an opening 44 with a tapered profile. Other methods, such as etching, can also be used to shape the via opening 44. For example, the via opening 44 can be partially filled with a protective material, and an etching is performed to remove the corner regions 49 of the IMD layer 36 (again, refer to FIG. 8).

Figure 10:
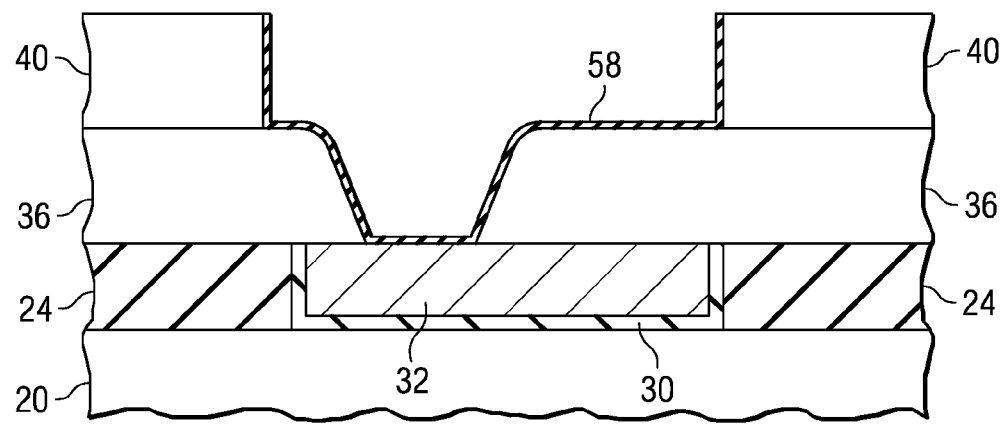

FIG. 10 illustrates the formation of a diffusion barrier layer 58, which prevents the subsequently deposited via material, particularly copper, from diffusing into the dielectric layer 24 and IMD layers 36 and 40. The diffusion barrier layer 58 is preferably formed of a material comprising titanium, titanium nitride, tantalum, and tantalum nitride, and may have a layered structure.

Figure 11:
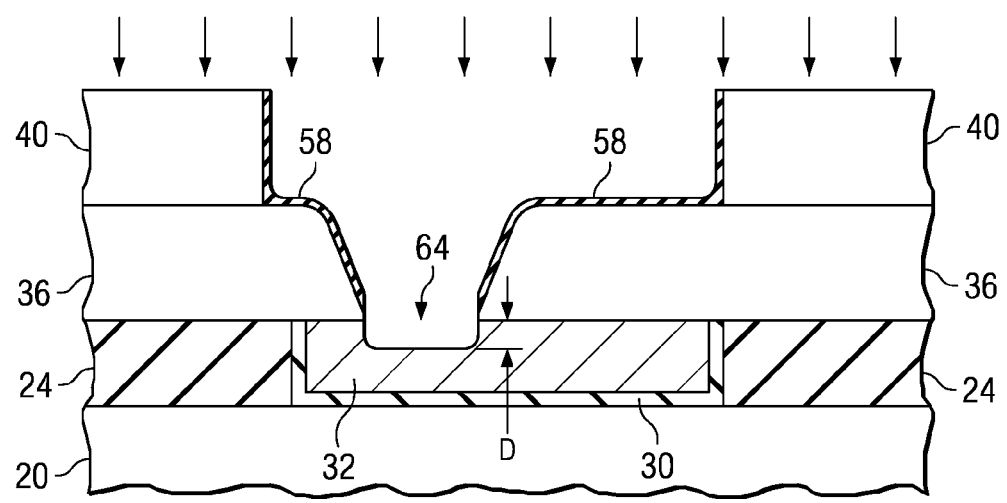

A recess 64 is formed in the conductive line 32, as shown in FIG. 11. In the preferred embodiment, the recess 64 is formed by sputtering. After sputtering, the bottom portion of the diffusion barrier layer 58 is removed, and the recess 64 extends into the conductive layer 32. The recess 64 preferably has a depth D of greater than 50 Å, and more preferably greater than about 200 Å, and even more preferably between about 200 Å and about 300 Å.

Figure 12:
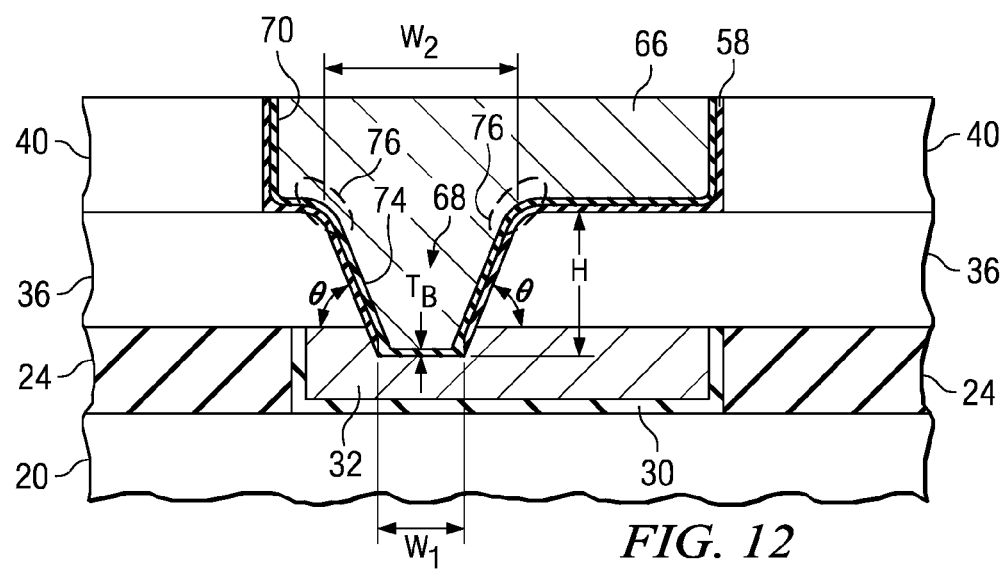

FIG. 12 illustrates the formation of a second conductive line 66 and a via 68 by filling the trench opening 46 and via opening 44 with a conductive material, which preferably comprises copper, aluminum, silver, gold, metal alloy, metal nitride, and the like. Prior to the formation of the conductive line 66 and via 68, an additional diffusion barrier layer 70 is preferably formed on the diffusion barrier layer 58. To have a reduced resistance, diffusion barrier layers 58 and 70 preferably have a bottom thickness $T_B$ of less than about 120 Å. A CMP is then performed to remove excess material.

Figure 1:
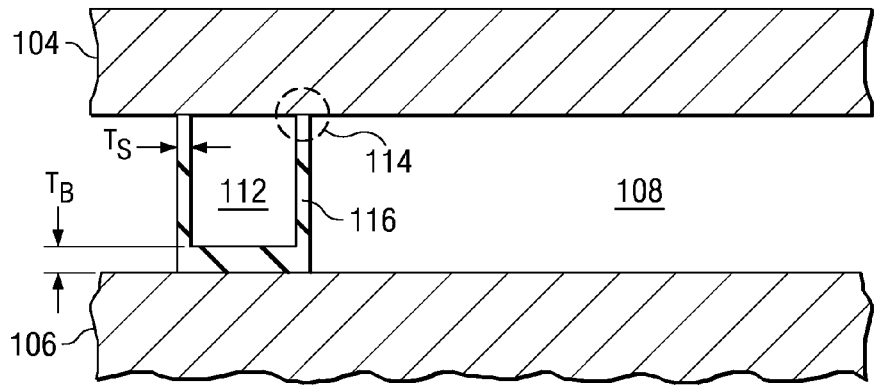
FIG. 1 illustrates a conventional via structure having a substantially vertical sidewall.
Figure 2:
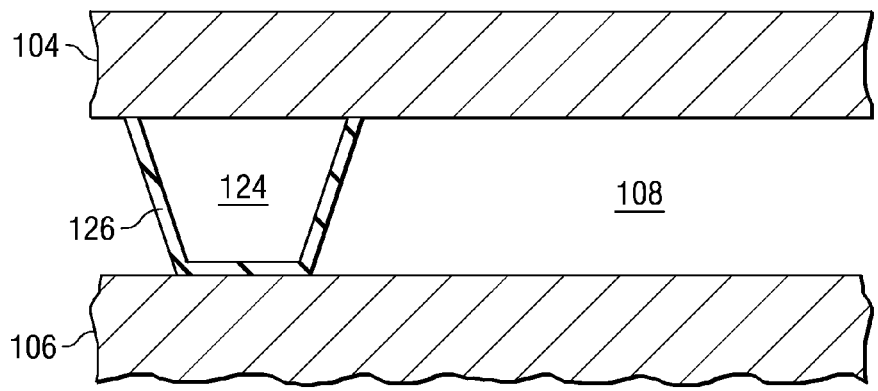
FIG. 2 illustrates a tapered via structure.

The tapered via 68 has a bottom width $W_1$ and a top width $W_2$ substantially greater than $W_1$. Compared to FIG. 1, the material of the current crowding regions 114 is replaced by a conductive material, thus the current crowding effects are alleviated. Rounded interface regions 76 between the via 68 and the conductive line 66 further contribute to the reduction of the current crowding effects.

In the preferred embodiment, the top width $W_2$ is greater than about 126 percent of the bottom width $W_1$, that is, $(W_2-W_1)/W_1$ is greater than about 0.26. The ratio of a height H to the bottom width $W_1$ of the via is preferably greater than about 3/2. In the preferred embodiment wherein the sidewall 74 is substantially straight, a tilt angle θ can be defined as an indicator of the via profile. The tilt angle θ is preferably less than about 85 degrees, and more preferably less than about 75 degrees, and even more preferably less than about 65 degrees.

The tapered profile of the via 68 results in a more uniform step coverage of the diffusion barrier layers 58 and 70, which in turn helps reduce the bottom thickness $T_B$ of the diffusion barrier layers 70 and 58, hence reducing the resistance of the via 68. However, due to process variations, the via 68 may have different profiles, such as shown in FIGS. 13A through 13F. The sidewall of the via 68 may comprise portions that are substantially slanted, and portions that are substantially vertical, however, the total height ($a_0$ or sum of $a_{01}$, $a_{02}$, etc.) of the substantially vertical portions is preferably less than about ⅘ of the overall height H of the via.

Figure 13A:
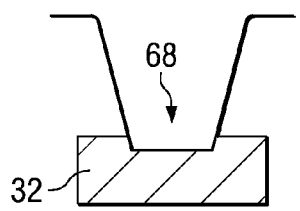
FIGS. 13A through 13F illustrate different profiles of tapered vias.
Figure 13D:
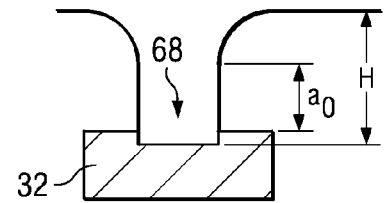
Figure 13B:
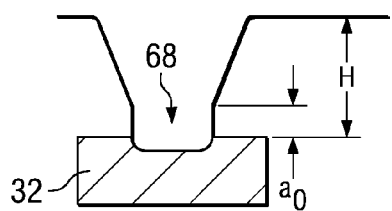
Figure 13E:
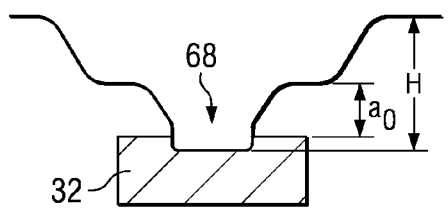
Figure 13C:
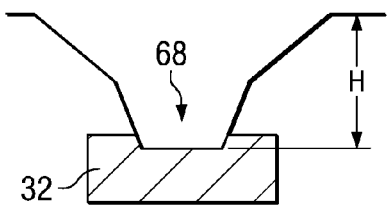
Figure 13F:
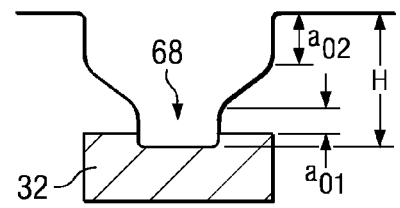

The via 68 may comprise substantially straight portions, as shown in FIGS. 13A, 13B and 13C, or comprise substantially rounded portions, as shown in FIGS. 13D, 13E and 13F. Although the via profiles are different, there is at least a significant portion, preferably the entire sidewall, that is substantially tapered.

The reliability of a via is typically determined by a maximum current density $J_{max}$ in the via region since the region where maximum current density $J_{max}$ occurs is the weakest. The combination of a tapered via 68 and a recess 64 induces a low maximum current density $J_{max}$. Experiments reveal that when a certain current is applied to vias, a via having a recess, but no tapered profile, has a maximum current density $J_{max}$ of about 6.7E−02 mA/cm$^2$, a via having a tapered profile, but no recess, has a maximum current density $J_{max}$ of about 6.8E−02 mA/cm$^2$, while a preferred embodiment of the present invention, which has a tapered profile and a recess, has a maximum current density $J_{max}$ of about 5.6E−02 mA/cm$^2$.

The preferred embodiments of the present invention also demonstrate lower resistances. Experiments have revealed that if a via having a tapered profile, but no recess, has a normalized resistance of 1, then a via having a recess, but no tapered profile, has a normalized resistance of about 1.01, and a via having both a tapered profile and a recess has a normalized resistance of about 0.93.

The preferred embodiment of the present invention has several advantageous features. With a diffusion barrier layer having a tapered profile, thus a reduced thickness at the via bottom, the via resistance is reduced, and the performance of the integrated circuits using the preferred embodiments of the present invention are improved. The reliability of the via is improved due to reduced current crowding effects in the via region.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present invention. Accordingly, the appended claims are intended to include within their scope such processes, machines, manufacture, compositions of matter, means, methods, or steps.

What is claimed is:

1. A method, comprising:
   forming a first conductor over a semiconductor substrate;
   forming a first dielectric layer over the first conductor;
   forming a second dielectric layer over the first dielectric layer;
   forming a via opening extending through the second dielectric layer and the first dielectric layer and extending to a top surface of the first conductor;
   forming a trench in the second dielectric layer that includes the via opening in the second dielectric layer and that extends over the via opening in the first dielectric layer;
   patterning the via opening in the first dielectric layer by removing the first dielectric layer at the upper corners of the via opening in the first dielectric layer, wherein the via opening has a tapered profile with a width of the via opening gradually increasing substantially throughout from a bottom end to a top end, wherein the corners formed at the intersection of the top of the via opening in the first dielectric material and the trench in the second dielectric layer are rounded;
   forming a via recess extending from the top surface of the first conductor to form a recess of a predetermined depth in the first conductor;
   filling the via opening with a conductor to form a via structure, and wherein the via structure includes the conductor that further extends into the via recess in the first conductor; and forming a second conductor in the trench over the first dielectric layer and adjoining the via structure at the top end.

2. The method of claim 1 wherein forming the via opening comprises performing an isotropic etch process on the dielectric layer to form the via opening, and wherein patterning the via opening further comprises subsequently shaping the via opening by performing a physical bombardment process.

3. The method of claim 2 wherein performing the physical bombardment process comprises physically bombarding the via opening with argon.

4. The method of claim 3 wherein performing the physical bombardment process comprises physically bombarding the via opening using a scattering factor of greater than about 70 percent.

5. The method of claim 3, wherein performing the physical bombardment process comprises physically bombarding the via opening using a bombardment energy of greater than about 5 eV.

6. The method of claim 3, wherein performing the physical bombardment comprises physically bombarding the via opening using a bombardment time of greater than about 4 seconds.

7. The method of claim 3, wherein performing the physical bombardment further comprises performing a first physical bombardment on the via opening with a first scattering factor followed by performing a second physical bombardment on the via opening with a second scattering factor different from the first scattering factor.

8. The method of claim 1, wherein forming the via recess comprises performing sputtering.

9. The method of claim 8, wherein forming the via recess comprises performing sputtering on the first conductor to form the recess to a depth of greater than about 50 Angstroms.

10. The method of claim 8, wherein forming the via recess comprises performing sputtering on the first conductor to form the recess to a depth between 50 and 300 Angstroms.

11. The method of claim 1, wherein forming the dielectric layer comprises depositing one selected from the group consisting essentially of carbon-doped silicon oxide, fluorine-doped silicon oxide, organic low-k materials, and porous low-k materials.

12. The method of claim 1, wherein the forming the dielectric layer comprises depositing a dielectric layer having a dielectric constant of less than about 3.5.

13. The method of claim 1, wherein filling the via opening with the conductor further comprises filling the via opening with a material that is one selected from the group consisting essentially of copper, aluminum, silver, gold, metal alloy, metal nitride and combinations thereof.

14. A method for forming a via structure, comprising:
forming a first dielectric layer;
forming a first metal line conductor in the first dielectric layer;
forming a second dielectric layer over the first dielectric layer and the first metal line conductor;
forming a via opening extending through the second dielectric layer to a top surface of the first metal line conductor;
patterning the via opening by removing the second dielectric layer in the corner regions at the upper portion of the via opening, the via opening having a tapered with a width of the via opening gradually increasing substantially throughout from a bottom end to a top end;
forming a via recess in the first metal line conductor adjacent to the via opening, the via recess extending from the top surface of the first metal line conductor to form a recess of a predetermined depth;
filling the via opening with a conductor to form the via structure, and wherein the via structure includes the conductor that further extends into the via recess in the first metal line conductor; and
forming a second metal line conductor comprising an additional metal line formed over and adjoining the via structure at the top end, the corners of the via opening being rounded where the via opening intersects the second metal line conductor.

15. The method of claim 14, wherein patterning the via opening further comprises performing an etch on the second dielectric layer to form the via opening and performing a physical bombardment on the via opening to shape the via opening.

16. The method of claim 14 wherein the via structure has a top width and a bottom width, and wherein the top width is greater than about 126 percent of the bottom width.

17. The method of claim 14 wherein the via structure has a width difference between a top width and a bottom width, and wherein a height and the bottom width of the via opening have a ratio of greater than about 3/2.

18. The method of claim 14 wherein sidewalls of the via opening are substantially straight, and have a tilt angle of less than about 85 degrees.

19. The method of claim 14 wherein forming the via recess comprises performing sputtering on the first metal line conductor to form the recess to a depth of greater than about 50 Å.

20. The method of claim 14, wherein forming the first metal line conductor and filling the via opening with the conductor both comprise forming copper.

* * * * *